(12) United States Patent
Choi et al.

(10) Patent No.: US 10,969,680 B2
(45) Date of Patent: Apr. 6, 2021

(54) SYSTEM AND METHOD FOR ADJUSTING A POSITION OF A TEMPLATE

(71) Applicant: Canon Kabushiki Kaisha, Tokyo (JP)

(72) Inventors: Byung-Jin Choi, Austin, TX (US); Makoto Mizuno, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 695 days.

(21) Appl. No.: 15/365,416

(22) Filed: Nov. 30, 2016

(65) Prior Publication Data
US 2018/0149968 A1     May 31, 2018

(51) Int. Cl.
G03F 7/00     (2006.01)
B29C 43/58    (2006.01)

(52) U.S. Cl.
CPC ............ G03F 7/0002 (2013.01); B29C 43/58 (2013.01); *B29C 2043/5833* (2013.01)

(58) Field of Classification Search
CPC .............................. B29C 43/58; G03F 7/0002
See application file for complete search history.

(56) References Cited

U.S. PATENT DOCUMENTS

| | | | |
|---|---|---|---|
| 5,191,200 A | 3/1993 | van der Werf et al. |
| 5,602,400 A | 2/1997 | Kawashima |
| 6,873,087 B1 | 3/2005 | Choi et al. |
| 6,932,934 B2 | 8/2005 | Choi et al. |
| 7,157,036 B2 | 1/2007 | Choi et al. |
| 8,318,066 B2 | 11/2012 | Sreenivasan et al. |
| 2004/0124566 A1 | 7/2004 | Sreenivasan et al. |
| 2004/0188381 A1 | 9/2004 | Sreenivasan |
| 2004/0211754 A1 | 10/2004 | Sreenivasan |

(Continued)

FOREIGN PATENT DOCUMENTS

| | | |
|---|---|---|
| CN | 1454333 A | 11/2003 |
| CN | 101292195 A | 10/2008 |

(Continued)

OTHER PUBLICATIONS

Choi, Byung-Jin; U.S. Appl. No. 15/338,735 (unpublished), filed Oct. 31, 2016.

(Continued)

*Primary Examiner* — Joseph S Del Sole
*Assistant Examiner* — John Robitaille
(74) *Attorney, Agent, or Firm* — Canon U.S.A., Inc. IP Division

(57) ABSTRACT

Methods, systems, and apparatus for adjusting a relative position of templates including determining a first plurality of position points of a surface of a region adjacent to an active region of a first template, the surface of the adjacent region and a surface of the active region forming a continuous surface of the first template; identifying a plane of the surface of the adjacent region of the first template based on the first plurality of position points; determining a second plurality of position points of a surface of an active region of a second template, the active region of the second template protruding from a surface of the second template; identifying a plane of the surface of the active region of the second template based on the second plurality of position points; and adjusting a relative position of the first template and the second template based on the identified planes.

20 Claims, 5 Drawing Sheets

(56) References Cited

U.S. PATENT DOCUMENTS

| | | |
|---|---|---|
| 2005/0187339 A1 | 8/2005 | Xu et al. |
| 2006/0157444 A1 | 7/2006 | Nakamura et al. |
| 2006/0279025 A1* | 12/2006 | Heidari ............... B29C 33/3857 264/496 |
| 2007/0200276 A1* | 8/2007 | Mackey ................. B82Y 10/00 264/293 |
| 2009/0262320 A1 | 10/2009 | Staals et al. |
| 2013/0015599 A1 | 1/2013 | Kawahara |
| 2015/0022793 A1 | 1/2015 | Koga et al. |

FOREIGN PATENT DOCUMENTS

| | | |
|---|---|---|
| CN | 102203672 A | 9/2011 |
| CN | 104317161 A | 1/2015 |
| CN | 105700291 A | 6/2016 |
| JP | 2013219230 | 10/2013 |
| KR | 2010-0131375 A | 12/2010 |

OTHER PUBLICATIONS

Choi et al.; U.S. Appl. No. 15/350,714 (unpublished), filed Nov. 14, 2016.

Choi, Byung-Jin; U.S. Appl. No. 15/385,353 (unpublished), filed Dec. 20, 2016.

* cited by examiner

SYSTEM AND METHOD FOR ADJUSTING A POSITION OF A TEMPLATE

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

SUMMARY

Innovative aspects of the subject matter described in this specification may be embodied in methods that include the actions of adjusting a relative position of a first imprint lithography template and a second imprint lithography template, including determining a first plurality of position points of a surface of a region adjacent to an active region of a first template, the surface of the adjacent region and a surface of the active region forming a continuous surface of the first template; identifying a plane of the surface of the adjacent region of the first template based on the first plurality of position points; determining a second plurality of position points of a surface of an active region of a second template, the active region of the second template protruding from a surface of the second template; identifying a plane of the surface of the active region of the second template based on the second plurality of position points; and adjusting a relative position of the first template and the second template based on the plane of the surface of the adjacent region of the first template and the plane of the surface of the active region of the second template.

Other embodiments of these aspects include corresponding systems and configured to perform the actions of the methods.

These and other embodiments may each optionally include one or more of the following features. For instance, comparing the plane of the surface of the adjacent region of the first template and the plane of the surface of the active region of the second template; and based on the comparison, assessing a leveling error between the plane of the surface of the adjacent region of the first template and the plane of the surface of the active region of the second template, wherein adjusting the relative position of the first template and the second template is based on the leveling error. The relative position of the first template and the second template is adjusted to compensate for the leveling error. Adjusting the relative position of the first template and the second template includes adjusting a relative angle between the plane of the surface of the adjacent region of the first template and the plane of the surface of the active region of the second template. The adjacent region of the first template surrounds the active region of the first template. The active region of the first template includes one or more patterning features. The active region of the second template is substantially planar. The first plurality of position points and the second plurality of position points are determined concurrently in time.

Innovative aspects of the subject matter described in this specification may be embodied in a system for adjusting a relative position of a first imprint lithography template and a second imprint lithography template, the system including a first template holder configured to hold a first template, the first template including an active region and a region adjacent to the active region, wherein a surface of the adjacent region and a surface of the active region form a continuous surface of the first template; a second template holder configured to hold a second template, the second template including an active region, the active region of the second template protruding from a surface of the second template; a first sensing device configured to determine a first plurality of position points of the surface of the adjacent region of the first template; a second sensing device configured to determine a second plurality of position points of the surface of the active region of the second template; an actuator system configured to adjust a relative position of the first template and the second template; and a processing device configured to i) identify a plane of the surface of the adjacent region of the first template based on the first plurality of position points, ii) identify a plane of the active region of the surface of the second template based on the second plurality of position points, and iii) provide a signal to the actuator system such that the actuator system adjusts the relative position of the first template and the second template based on the plane of the surface of the adjacent region of the first template and the plane of the surface of the active region of the second template.

Other embodiments of these aspects include corresponding methods performed by the system.

Particular implementations of the subject matter described in this specification can be implemented so as to realize one or more of the following advantages. Implementations of the present disclosure provide minimizing, if not preventing, i) image placement error of the replica template, ii) uneven fluid spreading of a material positioned on the replica template, and iii) fluid extrusion beyond a desired zone on the replica template.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

This document describes methods and systems that provide adjusting of a relative position of a first imprint lithography template and a second imprint lithography template. Specifically, a first plurality of position points of a surface of a region adjacent to an active region of a first template are determined. The surface of the adjacent region and a surface of the active region form a continuous surface of the first template. A plane of the surface of the adjacent region of first template is identified that is based on the first plurality of position points. A second plurality of position points of a surface of an active region of a second template are determined. The active region of the second template protrudes from a surface of the second template. A plane of the surface of the active region of the second template is identified that is based on the second plurality of position points. A relative position of the first template and the second template is adjusted based on the plane of the surface of the adjacent region of the first template and the plane of the surface of the active region of the second template.

Figure 1:
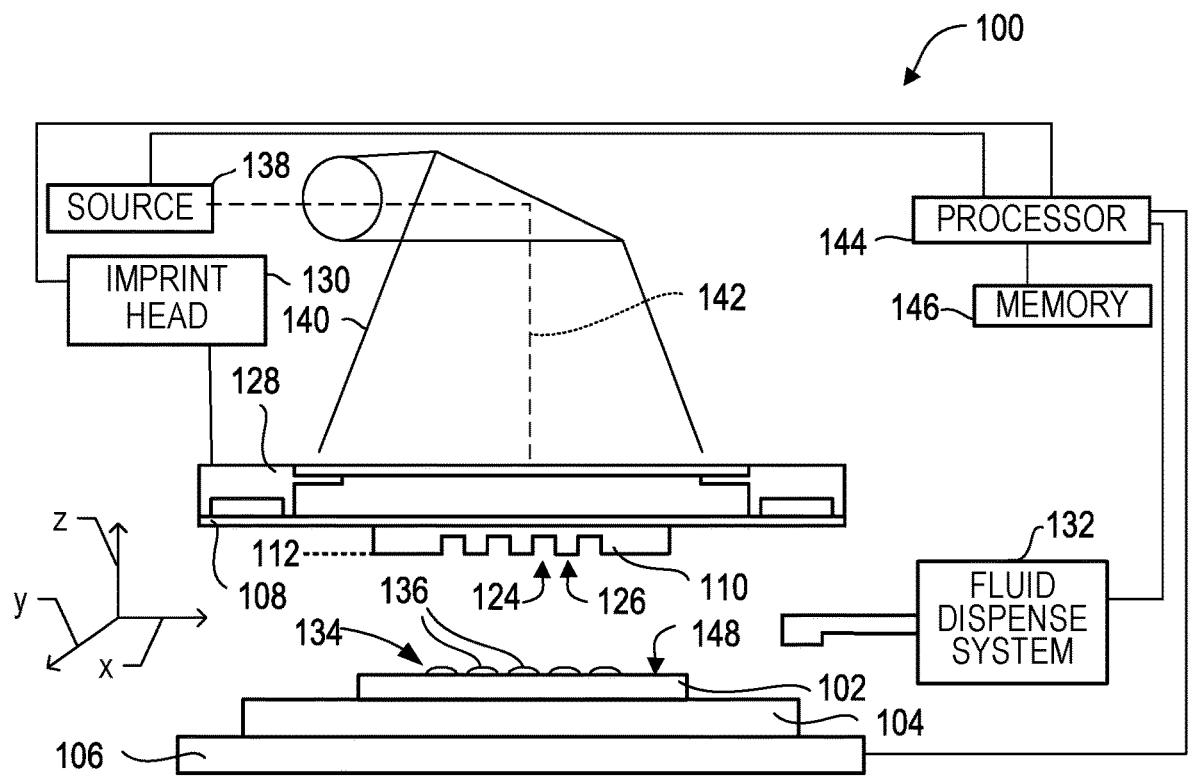
FIG. 1 illustrates a simplified side view of a lithographic system in accordance with embodiments of the present invention.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides motion about one or more of the x-, y-, and z-axes, and/or rotational movement about the z-axis. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 122 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. Further, the template chuck 128 may be coupled to an imprint head 130 such that the template chuck 128 and/or the imprint head 130 may be configured to facilitate movement of the template 118.

The imprint lithography system 100 may further comprise a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may comprise a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
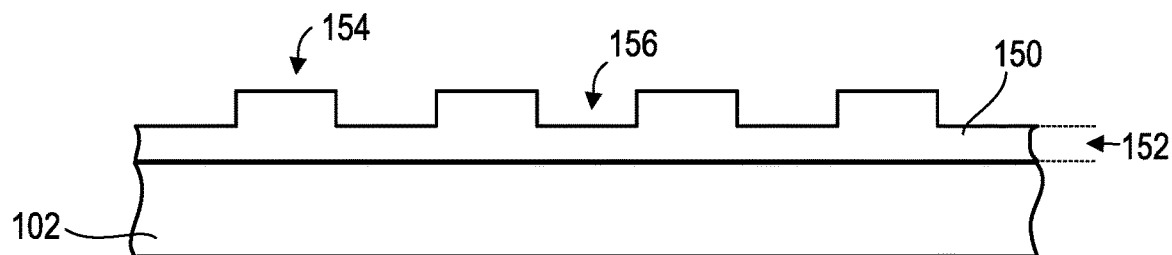
FIG. 2 illustrates a simplified side view of the substrate shown in FIG. 1 having a patterned layer positioned thereon.

Referring to FIGS. 1 and 2, the imprint lithography system 100 may further comprise an energy source 138 coupled to direct energy 140 along a path 142. In some examples, the imprint head 130 and the stage 106 is configured to position the template 108 and the substrate 102 in superimposition with the path 142. The imprint lithography system 110 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 40, e.g., broadband ultraviolet radiation, causing the polymerizable material 134 to solidify and/or cross-link conforming to shape of a surface 148 of the substrate 102 and the patterning surface 122, defining a patterned layer 150 on the substrate 102. In some examples, the patterned layer 150 may comprise a residual layer 152 and a plurality of features shown as protrusions 154 and recessions 156, with the protrusions 154 having a thickness $t_1$ and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

In some examples, the method described above may be employed in template replication, e.g., for use in imprint lithography. That is, the template 108 can include a master (first) template and the substrate 102 can include a replica (second) template. By way of illustration, as described herein, the first template is referred to as a "master" template, and the second template is referred to as a "replica" template formed from the master template in an imprint lithography process. However, it is understood that the first template and the second template are not so limited.

To that end, prior to forming the patterned layer 150, and specifically, prior to template replication, a desired alignment between the template 108 and the substrate 102 is obtained. Specifically, a relative tilting between the substrate 102 and the template 108 and/or a shape profile of the substrate 102 and the template 108 is determined to minimize, if not prevent, uneven fluid spreading (of the polymerizable material 134), image placement error, and fluid extrusion.

Figure 3A:
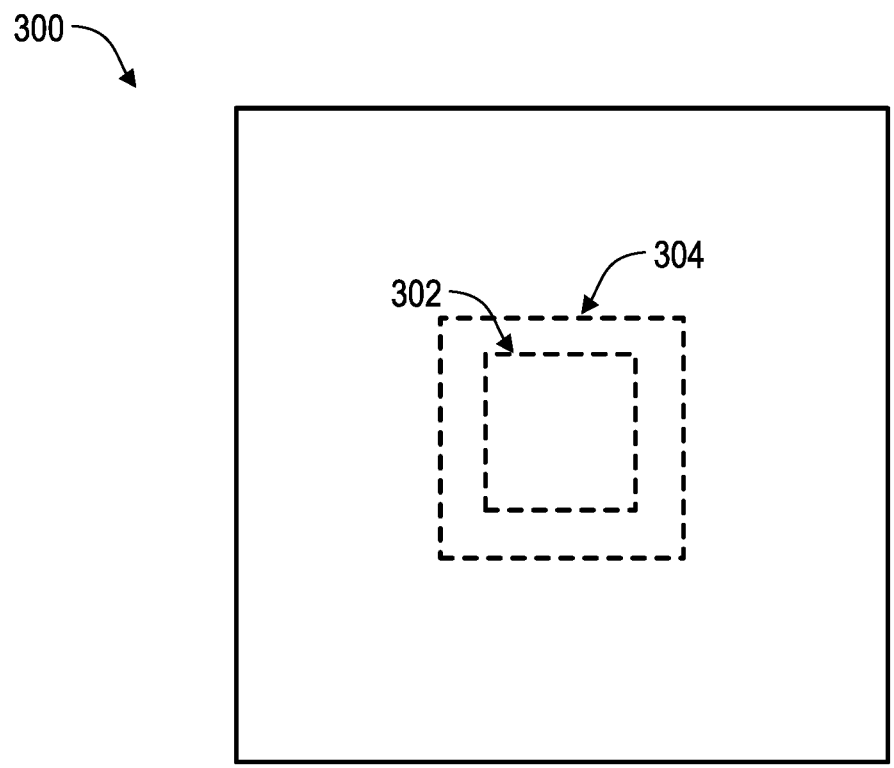
FIG. 3A illustrates a top down view of a master template.
Figure 3B:
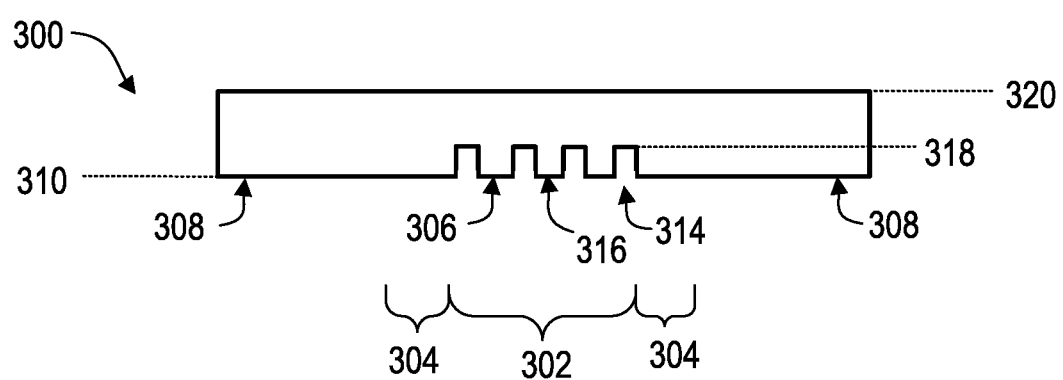
FIG. 3B illustrates a side view of the master template

FIGS. 3A and 3B illustrate a first template 300. As described herein, first template 300 is referred to as a "master" template; however, it is understood that first template is not so limited. Specifically, FIG. 3A illustrates a top down view of the master template 300, and FIG. 3B illustrates a side view of the master template 300. The master template 300 includes an active region 302 and an adjacent region 304. As illustrated, the adjacent region 304 completely surrounds the active region 302; however, the adjacent region 304 can partially surround the active region 302. In some examples, the active region 302 is 26 millimeters by 33 millimeters, and the adjacent region 304 may extend approximately 10 millimeters around the active region 302. In some examples, the adjacent region 304 may extend approximately 5 millimeters around the active region 302.

The active region 302 is associated with a first surface 306 and the adjacent region 304 is associated with a second surface 308. The first surface 306 and the second surface 308 form a continuous surface 310 of the master template 300. That is, in some examples, the master template 300, and the continuous surface 310, are absent any protruding features.

In some examples, the active region 302 includes patterning features. The patterning features can include a plurality of recessions 314 that define a plurality of protrusions 316 therebetween that extend from a surface 318. However, the depth of the surface 318 (as relative to the continuous surface 310) can vary for each recession 314. Furthermore, the feature sizes and density of the patterning features (e.g., height and/or width) can vary based on the specific application of the master template 300. In some examples, the master template 300 includes a substantially uniform thickness across the body of the master template 300, e.g., thickness between the continuous surface 310 and an opposite surface 320.

Figure 4A:
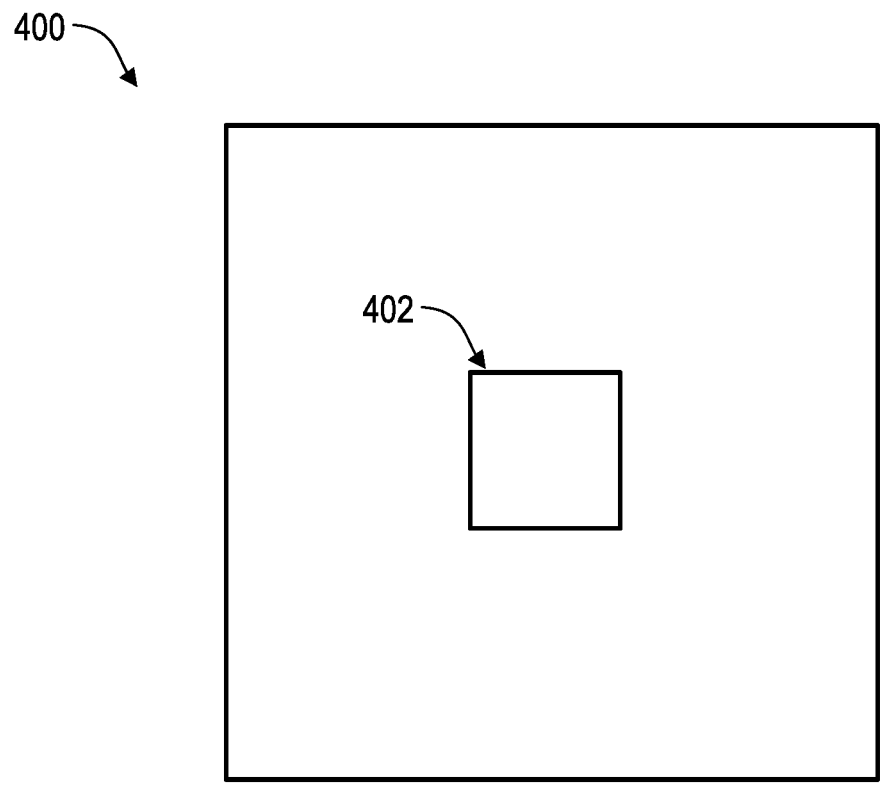
FIG. 4A illustrates a top down view of a replica template.
Figure 4B:
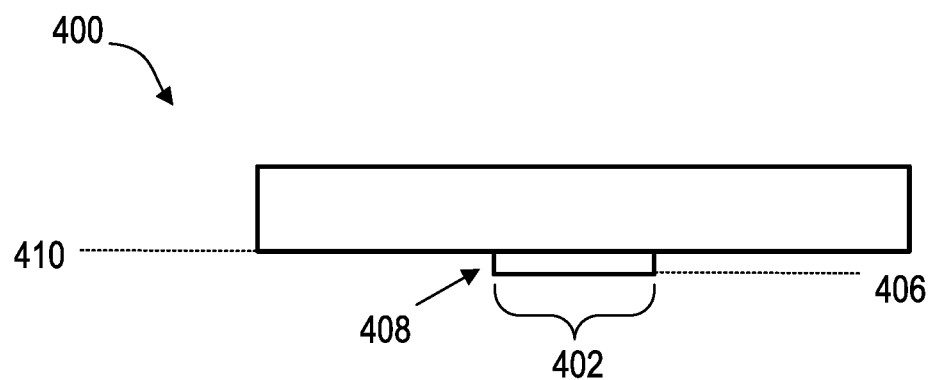
FIG. 4B illustrates a side view of the replica template.

FIGS. 4A and 4B illustrate a second template 400. As described herein, second template is referred to as a "replica" template; however, it is understood that second template is not so limited. Specifically, FIG. 4A illustrates a top down view of the replica template 400 and FIG. 4B illustrates a side view of the replica template 400. The replica template 400 includes an active region 402. The active region 402 is associated with a third surface 406. In some examples, the active region 402 includes a mesa 408, with the mesa 408 (and the active region 402) protruding from a fourth surface 410 of the replica template 400. In some examples, the mesa 408 is formed by chemical etching processes (e.g., wet etching).

In some examples, the active region 402 is substantially planar. That is, the active region 402 is substantially devoid of any patterning features. In some examples, the replica template 400 is a hollow (cored-out) template. That is, a thickness of the replica template 400 proximate to the active region 402 is substantially thinner than a thickness of the replica template 400 outside of the active region 402. In some examples, the thickness of the replica template 400 proximate to the active region 402 is approximately 1.1 millimeters, and the thickness of the replica template 400 outside of the active region 402 is approximately 0.25 inches (6.35 millimeters+/−0.1 millimeter).

Figure 5:
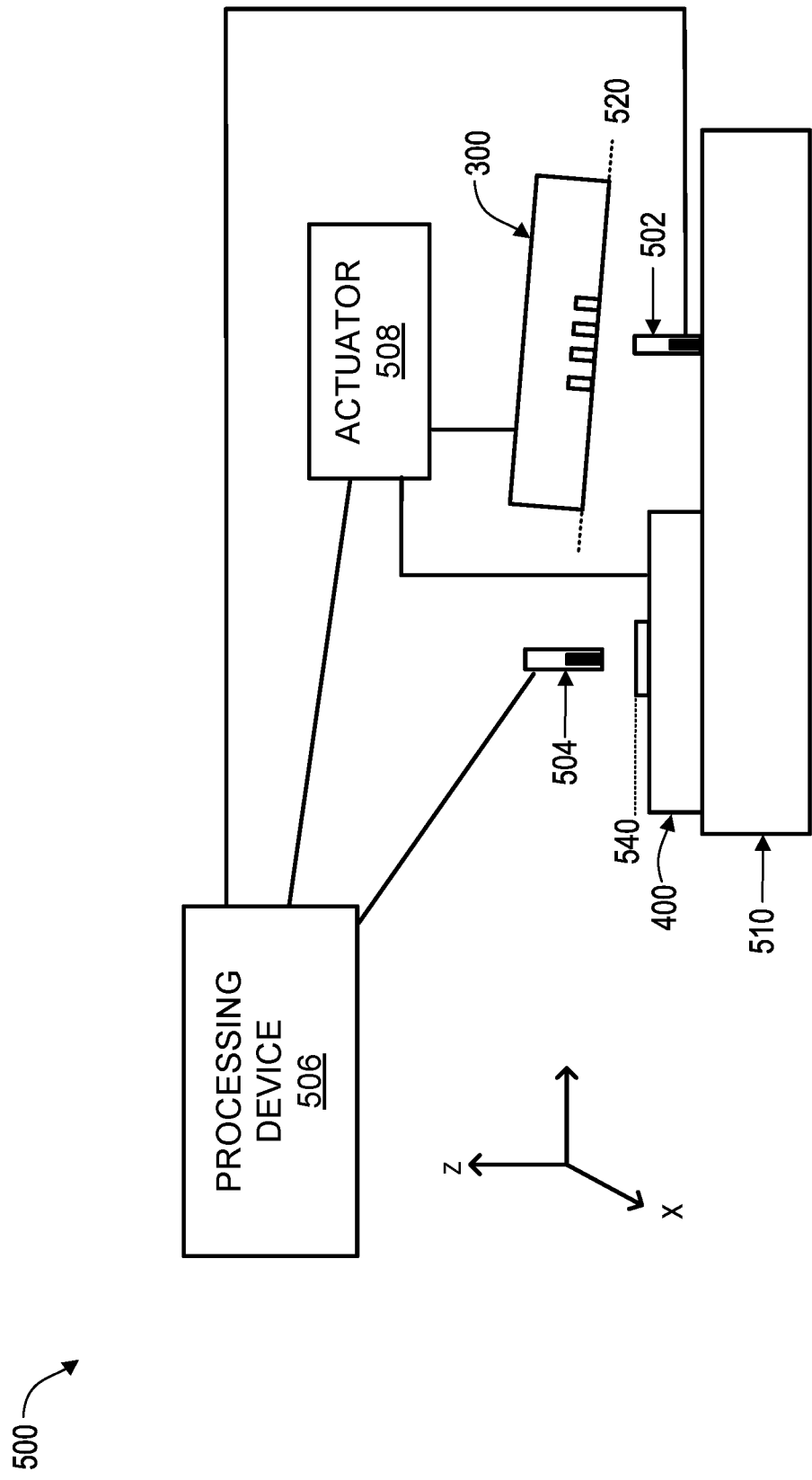
FIG. 5 illustrates a system for adjusting a relative position of the master template and the replica template.

FIG. 5 illustrates a system 500 for adjusting a relative position of the master template 300 and the replica template 400. The system 500 includes a first sensing device 502, a second sensing device 504, a processing device 506, an actuator system 508, and a stage 510. The processing device 506 is in communication with the first sensing device 502, the second sensing device 504, and the actuator system 508.

The first sensing device 502 determines a plurality of position points of the second surface 308 of the adjacent region 304 of the master template 300. In some examples, determining the plurality of position points of the second surface 308 can include the first sensing device 502 measuring a distance between the first sensing device 502 and the second surface 308 at a plurality of locations. To determine the plurality of position points of the second surface 308, as illustrated, the stage 510 provides movement (e.g., along the x- and y-axes) of the first sensing device 502 with respect to the master template 300. However, in some examples, movement may be provided to the master template 300 and/or the first sensing device 502. To that end, by providing relative movement between the first sensing device 502 and the master template 300, the first sensing device 502 determines the plurality of position points of the second surface 308 of the adjacent region 304 of the master template 300.

The second sensing device 504 determines a plurality of position points of the third surface 406 of the active region 402 of the replica template 400. In some examples, determining the plurality of position points of the third surface 406 can include the second sensing device 504 measuring a distance between the second sensing device 504 and the third surface 406 at a plurality of locations. To determine the plurality of position points of the third surface 406, as illustrated, the stage 510 provides movement (e.g., along the x- and y-axes) of the replica template 400 with respect to the second sensing device 504. However, in some examples, movement may be provided to the replica template 400 and/or the second sensing device 504. To that end, by providing relative movement between the second sensing device 504 and the replica template 400, the second sensing device 504 determines the plurality of position points of the third surface 406 of the active region 402 of the replica template 400.

In some examples, the first sensing device 502 determines the plurality of position points of the second surface 308 of the adjacent region 304 of the master template 300 and the second sensing device 504 determines the plurality of position points of the third surface 406 of the active region 402 of the replica template 400 concurrently. That is, the determination of at least a portion the plurality of points associated with the second surface 308 and at least a portion the plurality of points associated with the third surface 406 overlap in time. However, in some examples, the first sensing device 502 determines the plurality of position points of the second surface 308 of the adjacent region 304 of the master template 300 and the second sensing device 504 determines the plurality of position points of the third surface 406 of the active region 402 of the replica template 400 sequentially. That is, for example, the first sensing device 502 determines the plurality of position points of the second surface 308 prior to the second sensing device 504 determining the plurality of position points of the third surface 406 (and vice versa).

The processing device 506 identifies respective planes of the master template 300 and the replica template 400. Specifically, the processing device 506 identifies a first plane 520 of the second surface 308 of the adjacent region 304 of the master template 300. In some examples, the processing device 506 identifies the first plane 520 based on the plurality of position points of the second surface 308 of the adjacent region 304 of the master template 300. That is, the processing device 506, in some examples, models the second surface 308 based on the determined plurality of position points thereof, and based on such model, is able to identify the first plane 520 of the second surface 308.

In some examples, the processing device 506 determines a shape profile of the second surface 308 of the adjacent region 304 of the master template 300. That is, the second surface 308 can have a shape that varies across the master template 300, e.g., with respect to a substantially flat profile. For example, the second surface 308 can have one or more undulations with variations in frequency, depth, and spacing. The variations in the shape profile of the second surface 308 can be the result of subjecting the master template 300 to processing conditions in the formation of the master template 300.

Additionally, the processing device 506 identifies a second plane 540 of the third surface 406 of the active region 402 of the replica template 400. In some examples, the processing device 506 identifies the second plane 540 based on the plurality of position points of the third surface 406 of the active region 402 of the replica template 400. That is, the processing device 506, in some examples, models the third surface 406 based on the determined plurality of position points thereof, and based on such a model, is able to identify the second plane 540 of the third surface 406. In some examples, a relative angle α is defined between the first plane 520 and the second plane 540.

In some examples, similar to the second surface 308 of the adjacent region 304 of the master template 300, the processing device 506 determines a shape profile of the third surface 406 of the active region 402 of the replica template 400. That is, the third surface 406 can have a shape that varies across the replica template 400, e.g., with respect to a substantially flat profile. For example, the third surface 406 can have one or more undulations with variations in frequency, depth, and spacing. The variations in the shape profile of the third surface 406 can be the result of subjecting the replica template 400 to processing conditions in the formation of the replica template 400.

Figure 6:
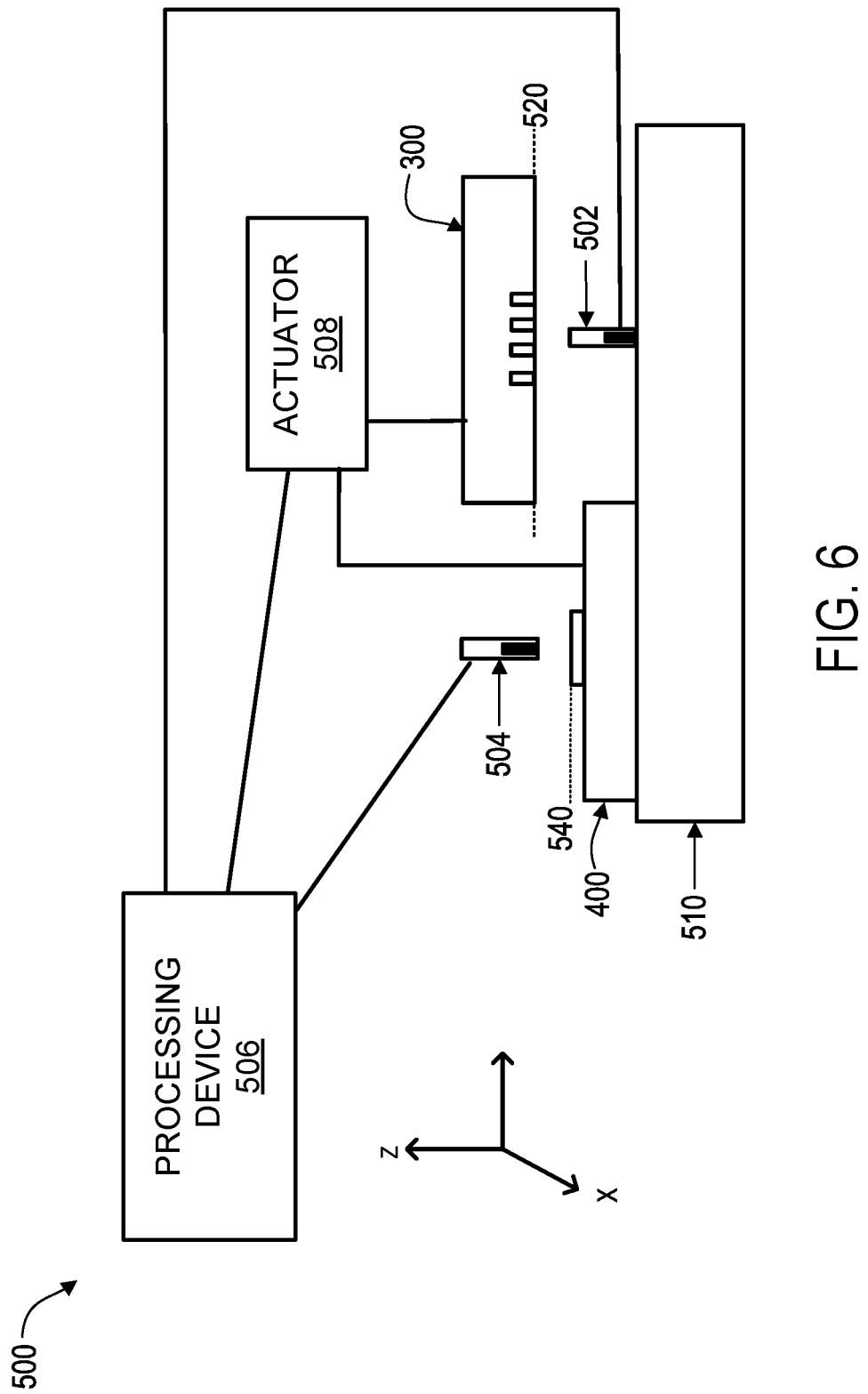
FIG. 6 illustrates the system after the relative position of the master template and the replica template is adjusted.

In some implementations, the actuator system 508 adjusts, based on a signal received from the processing device 506, a relative position of the master template 300 and the replica template 400 based on the first plane 520 of the adjacent region 304 of the master template 300 and the second plane 540 of the third surface 406 of the active region 402 of the replica template 400. Specifically, FIG. 6 illustrates the system 500 after the relative position of the master template 300 and the replica template 400 is adjusted. In some examples, the processing device 506 compares the first plane 520 of the second surface 308 of the adjacent region 304 of the master template 300 and the second plane 540 of the third surface 406 of the active region 402 of the replica template 400. Comparing the first plane 520 and the second plane 540 can include determining a magnitude of the angle α defined between the first plane 520 and the second plane 540. The processing device 506 can assess a leveling error between the first plane 520 and the second plane 540 based on the comparison. For example, the leveling error can include a difference between a desired angle between the first plane 520 and the second plane 540 and the measured angle α between the first plane 520 and the second plane 540. In some examples, the desired angle is based on desired processing conditions when forming a pattern in the replica template 400 by the master template 300. Specifically, the desired angle can be based on an image placement error of the pattern formed in the replica template 400. That is, the processing device 506 can determine the desired angle to compensate for the image placement error such that the master template 400 forms the desired pattern in the replica template 300.

In some examples, the image placement error of the pattern formed in the replica template 400 can result from non-uniform strain between the replica template 400 and the master template 300 from a tilting of the master template 300 with respect to the replica template 400. Specifically, in some examples, as the replica template 400 is a hollow (cored-out) and the master template 300 is of substantially uniform thickness, when tilting of the master template 300 is present with respect to the replica template 400, additional force (or down pressure) is applied at one area of replica template 400 during contact with the master template 300. This results in a lateral strain in the replica template 400 of the pattern formed in the replica template 400, for example, the patterned layer 150 when the patterned layer 150 is subjected to curing in the strained condition. After separation for the master template 300 and the replica template 400, the lateral strain dissipates, resulting in the image placement error and the shift in the desired pattern in the replica template 400. In some examples, when the replica template 400 is cored out, the third surface 406 can be maintained substantially flat by a pressure system applying a positive or negative pressure to a chamber adjacent to the third surface 406 and the active region 402 under control by the processing device 506.

To that end, the actuator system 508 adjusts the relative position of the master template 300 and/or the replica template 400 based on the leveling error, as described above. In some examples, the actuator system 508 provides movement to the master template 300, the replica template 400, or both, to adjust the relative position of the master template 300 and the replica template 400. The movement can include lateral movement along the x-, y-, and/or z-axes, and can further include tilting movement of the master template 300 and/or the replica template 400 with respect to a rotation point. The movement can further include adjusting a shape profile of the second surface 308 of the adjacent region 304 of the master template 300 and/or adjusting a shape profile of the third surface 406 of the active region 402 of the replica template 400.

In some examples, the actuator system 508 adjusts the relative position of the master template 300 and the replica template 400 to compensate for the leveling error. That is, the actuator system 508 adjusts the angle α between the first plane 520 and the second plane 520 to compensate for the leveling error, that is, reduce the leveling error to a desired level. Adjusting the angle α between the first plane 520 and the second plane 520 can include providing movement to the master template 300, the replica template 400, or both to adjust the relative position of the master template 300 and the replica template 400, as described above.

The invention claimed is:

1. A method for adjusting a relative position of a first imprint lithography template and a second imprint lithography template, the method comprising:

determining a first plurality of position points of a surface of an adjacent region adjacent to an active region of a first template, the active region of the first template including patterning features and the surface of the adjacent region and a surface of the active region forming a continuous surface of the first template, wherein determining the first plurality of position positions comprises providing relative movement between a first sensor and the first template and measuring a distance between the first sensor and the surface of the region adjacent to the active region of the first template at locations corresponding to the first plurality of position points;

identifying a plane of the surface of the adjacent region of the first template based on the first plurality of position points;

determining a second plurality of position points of a surface of an active region of a second template, wherein the active region of the second template protrudes from a surface of the second template and the patterning features of the first template are to be replicated on the protruded active region, wherein determining the second plurality of position points comprises providing relative movement between a second sensor and the second template and measuring a distance between the second sensor and the surface of the active region of the second template at locations corresponding to the second plurality of position points;

identifying a plane of the surface of the active region of the second template based on the second plurality of position points; and adjusting a relative position of the first template and the second template based on the plane of the surface of the adjacent region of the first template and the plane of the surface of the active region of the second template, wherein adjusting the relative position comprises obtaining a measured angle between the identified plane of the surface of the adjacent region of the first template and the identified plane of the surface of the active region of the second template and adjusting a relative angle between the first template and the second template based on the measured angle.

2. The method of claim 1, further comprising:

comparing the plane of the surface of the adjacent region of the first template and the plane of the surface of the active region of the second template; and based on the comparison, assessing a leveling error between the plane of the surface of the adjacent region of the first template and the plane of the surface of the active region of the second template, wherein adjusting the relative position of the first template and the second template is based on the leveling error.

3. The method of claim 2, wherein the relative position of the first template and the second template is adjusted to compensate for the leveling error.

4. The method of claim 1, wherein adjusting the relative position of the first template and the second template includes adjusting a relative angle between the plane of the surface of the adjacent region of the first template and the plane of the surface of the active region of the second template.

5. The method of claim 1, wherein the adjacent region of the first template surrounds the active region of the first template.

6. The method of claim 1, wherein the active region of the first template includes one or more patterning features.

7. The method of claim 1, wherein the active region of the second template is substantially planar.

8. The method of claim 1, wherein the first plurality of position points and the second plurality of position points are determined concurrently in time.

9. An imprint lithography method of manufacturing an article, the method comprising:

determining a first plurality of position points of a surface of an adjacent region adjacent to an active region of a first template, the active region of the first template including patterning features, and the surface of the adjacent region and a surface of the active region forming a continuous surface of the first template, wherein determining the first plurality of position points comprises providing relative movement between a first sensor and the first template and measuring a distance between the first sensor and the surface of the region adjacent to the active region of the first template at locations corresponding to the first plurality of points;

identifying a plane of the surface of the adjacent region of first template based on the first plurality of position points;

determining a second plurality of position points of a surface of an active region of a second template, wherein the active region of the second template protrudes from a surface of the second template and the patterning features of the first template are to be replicated on the protruded active region of the second template, wherein determining the second plurality of position points comprises providing relative movement between a second sensor and the second template and measuring a distance between the second sensor and the surface of the active region of the second template at locations corresponding to the second plurality of positions;

identifying a plane of the surface of the active region of the second template based on the second plurality of position points;

adjusting a relative position of the first template and the second template based on the plane of the surface of the adjacent region of the first template and the plane of the surface of the active region of the second template;

disposing an imprint resist on the second template; contacting the imprint resist with the first template;

polymerizing the imprint resist to yield a polymeric layer in contact with the first template;

separating the first template from the polymeric layer; and transferring a pattern of the polymeric layer into the substrate to yield the article, wherein adjusting the relative position comprises obtaining a measured angle between the identified plane of the surface of the adjacent region of the first template and the identified plane of the surface of the active region of the second template and adjusting a relative angle between the first template and the second template based on the measured angle.

10. The method of claim 9 wherein the article is a replica template.

11. The method of claim 1, wherein determining the first plurality of position points and determining the second plurality of position points occurs concurrently.

12. The method of claim 1, wherein providing relative movement between the first sensor and the first template comprises moving the first sensor, the first template, or both.

13. The method of claim 1, wherein providing relative movement between the second sensor and the second template comprising moving the second sensor, the second template, or both.

14. The method of claim 6, further comprising replicating patterning features included in the active region of the first template to the active region of the second template.

15. The method of claim 9, wherein determining the first plurality of position points and determining the second plurality of position points occurs concurrently.

16. The method of claim 9, wherein providing relative movement between the first sensor and the first template comprises moving the first sensor, the first template, or both.

17. The method of claim 9, wherein providing the relative movement between the second sensor and the second template comprises moving the second sensor, the second template, or both.

18. The method of claim 9, further comprising forming a pattern in the second template by the first template.

19. The method of claim 1, wherein a size of the active region of the first template is substantially the same as a size of the active region of the second template.

20. The method of claim 1, wherein the second template is a replica template being cored out, and the first template is a master template not being cored out.

\* \* \* \* \*